(12) United States Patent
Gruenberg et al.

(10) Patent No.: US 7,336,747 B2
(45) Date of Patent: Feb. 26, 2008

(54) CODING SYSTEM FOR MINIMIZING DIGITAL DATA BANDWIDTH

(75) Inventors: Elliot L. Gruenberg, West New York, NJ (US); Patrick Antaki, Plano, TX (US); Dhadesugoor Vaman, Frederick, MD (US); David N. Judelson, New York, NY (US)

(73) Assignee: Digital Compression Technology, New York, NY (US)

( * ) Notice: Subject to any disclaimer, the term of this patent is extended or adjusted under 35 U.S.C. 154(b) by 176 days.

(21) Appl. No.: 10/760,879

(22) Filed: Jan. 20, 2004

(65) Prior Publication Data

US 2004/0208271 A1   Oct. 21, 2004

Related U.S. Application Data

(60) Provisional application No. 60/440,952, filed on Jan. 17, 2003, provisional application No. 60/440,951, filed on Jan. 17, 2003, provisional application No. 60/440,954, filed on Jan. 17, 2003, provisional application No. 60/440,955, filed on Jan. 17, 2003.

(51) Int. Cl.
*H04B 1/10* (2006.01)

(52) U.S. Cl. .................................... 375/350

(58) Field of Classification Search ................ 375/355, 375/229, 350; 324/309, 310, 315, 321; 327/9, 327/45, 91, 94; 341/122; 708/300, 313
See application file for complete search history.

(56) References Cited

U.S. PATENT DOCUMENTS

| | | | |
|---|---|---|---|
| 4,534,257 A * | 8/1985 | Mitarai ........................ 84/617 |
| 4,601,046 A | 7/1986 | Halpern et al. |
| 4,857,928 A * | 8/1989 | Gailus et al. ................ 341/143 |
| 4,937,868 A | 6/1990 | Taguchi |
| 4,985,683 A * | 1/1991 | O'Neill .......................... 327/3 |
| 5,162,812 A | 11/1992 | Aman et al. |
| 5,777,909 A * | 7/1998 | Leung et al. ................ 708/300 |
| 5,822,370 A | 10/1998 | Graupe |
| 5,956,372 A | 9/1999 | Vaman et al. |
| 6,226,356 B1 | 5/2001 | Brown |
| 6,333,763 B1 | 12/2001 | Tanaka |
| 6,493,409 B1 * | 12/2002 | Lin et al. ..................... 375/375 |
| 6,665,338 B1 | 12/2003 | Midya et al. |
| 2003/0219085 A1 * | 11/2003 | Endres et al. ................ 375/350 |

* cited by examiner

*Primary Examiner*—Young T. Tse
(74) *Attorney, Agent, or Firm*—Keith D. Nowak; Carter Ledyard & Milburn LLP

(57) ABSTRACT

A digital compression system including a superresonant filter, which adds samples of a digital data signal at a frequency to previous samples. The added samples are parts of sine or cosine waves, not the sum of the waves. The output signal is actually the summation of the samples. The samples are made during at most a single period. The disclosed superresonant filter has a settling time significantly faster than prior art narrow band filters. Prior art narrow band filters passing approximately 1 Hz require approximately 1 second to settle. The disclosed superresonant filter passing 1 Hz will settle in approximately 1 microsecond.

5 Claims, 16 Drawing Sheets

SRF Internal Block Diagram

Time Domain Information Pulse Transformation

Block Diagram of Minimum Energy Receiver

SRF Internal Block Diagram

FIG. 11 Block diagram of modified SRF
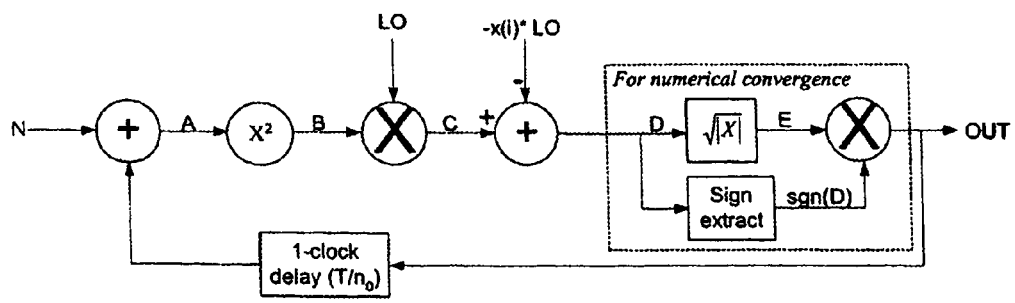
FIG. 12 Block diagram of a single-stage ESC-SRF (G-function)
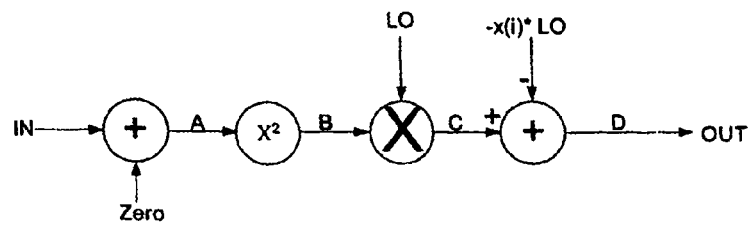
FIG. 13 Block diagram for ESC-SRF

CODING SYSTEM FOR MINIMIZING DIGITAL DATA BANDWIDTH

CROSS-REFERENCE TO RELATED APPLICATIONS

This application is based on and incorporates herein by reference, provisional patent application Nos. 60/440,952, filed Jan. 17, 2003; 60/440,951, filed Jan. 17, 2003; 60/440,954, filed Jan. 17, 2003; and 60/440,955, filed Jan. 17, 2003.

BACKGROUND OF THE INVENTION

It is known that the sum of sine waves of equal amplitudes but of fixed phase difference between each member is:

$$\sum_{0}^{n-1} e^{j(wt+n\Delta\phi)} = \frac{\sin((n\Delta\phi)/2)}{\sin((\Delta\phi)/2)} e^{j\omega t}$$

where $\Delta\Phi$ is the phase difference between the members which can be visualized as vectors. This sum can be formed from the input to a transmitter by adding inputs phase shifted by $\Delta\Phi$ to the input as shown in FIGS. 1A, 1B and 1C. We assume here that the signal input, $e^{j\omega t}$ are configured to sum with the amplitude in each path (branch).

In FIG. 1A, Item 1 is a channel filter allowing a band of frequencies to be received and supplied to the summer 2. The output of the summer is phase shifted in 3, which is a phase shifting device the phase shift of which is a function of frequency. The output of 3 is switched on or off by 4 in accordance with a control signal which may be data or timing bits. The switch output is fed back to the summer 2 and adds to the input in a phased manner as shown in vector form in FIG. 1B. That figure assumes there is no time delay around the loop.

If now the $\Delta\Phi$'s in the branches (paths) are made functions of the frequencies of input signals in the same manner as was done in the transmitter, the paths are independently responsive to the incoming signals according to their frequencies. Thus, an incoming group of signals to the sender is enhanced by the arrangement of FIG. 1A. The input signals remain substantially unchanged during this summing. For $\Delta\Phi=0$ the output is n=60 but for $\Delta\Phi$ greater than $\pi/n$ the magnitude is close to 0. A resulting plot for n=60 is shown in FIG. 1C. This plot shows that for. $\Delta\Phi=0$ the output is n=60 but for $\Delta\Phi$ greater than $\pi/n$ the magnitude is close to 0. Thus, a group of such paths phase shifted $2\pi/n$ from each other not typically interfere with each other. A switched phase inverter is connected to each independent phase path to control the built up signals in each path by inserting a 180° phase shift under the control of an information bit. When this is done, the summer becomes a subtractor and eliminates signal from that path. FIG. 2 shows such an arrangement for sending such bit controlled incremental phased signals.

The system consists of a transmit and receive location in each of which there are several branches. Phase shifters 101a . . . 101n are located in each of the transmit station branches. Each of these phase shifts $\Delta\Phi_1$, $\Delta\Phi_2$, . . . $\Delta\Phi_n$, varies distinctively with frequency. Switched Inverters 103, 103a . . . 103n are also in the respective branches. These switches are responsive to control signals from coder 100 which supplies different digital control pulse sequences to the individual branches. These switches may invert the phase of the branch signal, as stated above, or simply turn the branch on and off in accordance with the control signal. The timing is controlled by the clock 102. The outputs of all the branches are supplied to an adder 200 which also receives a band of signals from filter 106. This band of signals, $\Sigma_1 \cos \omega_1 t, \Sigma_2 \cos \omega_2 t, \ldots \Sigma_n \cos \omega_n t$, may originate from noise or a return path from the receiver.

Filter 114 represents the transmission channel bandpass. A group of frequencies selected by the transmitter process is supplied to adder 205, which sums this input with all of the outputs of the receiver branches. The output of 205 goes to all of the branches. Phase shifters 116, 116a . . . 116n are similar to 101, 101a . . . 101n and provide corresponding phase shifts for the same frequency of the corresponding transmitter branch. Units 140, 140a, . . . 140n limit the build up of signal in the branches. This is done by opening the channel for bit length periods only controlled by clock 102a. Bits are detected by amplitude detectors 130, 130a, . . . 130n when the built-up signals exceed a threshold. As shown in FIG. 2, gates 132, 132a, . . . , 132n enable signal flow to respective amplitude detectors 130, 130a, . . . , 130n while enabling simultaneous control of limiting units 140, 140a, . . . , 140n in accordance with the clock 102a. Clocks 102 and 102a are synchronized. Amplifier 115 may be used to offset transmission loss between receiver and transmitter.

FIG. 3 shows the operation of the oversampled digital spike bandpass filter. Each symbol (1 MHz symbol rate) received from the transmission channel is gated and used as the input to the spike bandpass filter. The gated symbol stored in buffer 351 is repeatedly clocked out at 100 MHz rate. That is, the repeated symbols appear at an oversampled symbol rate of 100 MHz at the input of the digital spike filters 352 and 352A. The last symbol of the output of the digital filters after a stable symbol recovery are gated out and the last noise symbol of 352A is subtracted from the signal plus noise symbol in summing amplifier 353 and stored in buffer 354. The stable output appears at the end of 1 microsecond. The samples in the symbol are then read out at 1 MHz rate from buffer 354, which is the symbol rate received from the sending side. This signal Y(t) is used as the input to counter 308 and computer 309 to develop DVx and Dvy components. The operation of the spike filters is entirely the same as previously described except that the noise filter 352A is tuned 1 kHz from the signal filter 352.

A simpler oversampled digital spike filter may be employed than the standard FIR. As shown in FIG. 4, it consists of a single delay unit 355. The output of the delay unit 355 is summed in adder 356 with the input so that the output is:

$E_n = e_n \sin \omega t + e_{n-1}(wt+\tau_0)$ where $\tau_0$ is the delay of unit 355. This signal is fed back to adder 357 where it adds to the incoming signal e. The successive summation after n iterations results in $E_n = (\sin n \ \omega t_o / \sin \omega t_o) e^{j\omega t_o}$, where $\omega = 2\pi f$. When $f=f_o$, $2\pi f_o$, $\pi_0 = 2\pi$, the magnitude of $E_n$ will=n, the maximum value, and the nulls occur at frequencies $n \pm f_o 2n$ from $f_o$ which defines the bandwidth of the filter. Thus, this system is a narrow pass filter. A filter tuned to the null frequency of 355 provides the noise subtracting signal. This filter is composed of delay 355A and adders 356A and 357A. Subtraction takes place in summation amplifier 358. However, the circuit shown in FIG. 4 has an inherent disadvantage in that the sampling rate is limited by the Q of the analog resonant circuit.

SUMMARY OF THE INVENTION

The invention described in this patent application is a digital compression technology for increasing the data throughput of telecommunications and broadcasting networks. The invention is applicable to telephone networks, including telephone twisted-pair wiring but not limited to it; coaxial cables for telephony, data transmission and video transmission with or without accompanying sound; microwave, cellular, mobile and personal communications networks; radio and satellite systems. The invention applies to multimedia applications in all of the above components of telecommunications and broadcast networks.

The inventive system compresses bandwidth to allow for minimum energy transmission by reducing the spectrum of the data. Each symbol period contains one sinusoid of a specific amplitude. Sampled inputs, samples of sine or cosine waves, vary in amplitude. The disclosed superresonant filter adds new samples to previous samples. It should be noted that the added samples are parts of sine or cosine waves, not the sum of the waves. While the output signal appears to be a spike, it is actually the summation of the samples. Each sample is slightly different in phase from the previous sample. As each sample is added to the previous sample, the effective bandwidth is lessened and the overall signal amplitude is increased. Each iteration has a slightly different phase except in the case of optimum performance where the phase is zero.

The disclosed superresonant filter has a settling time significantly faster than prior art narrow band filters. Prior art narrow band filters passing approximately 1 Hz require approximately 1 second to settle. For example, the disclosed superresonant filter passing 1 Hz will settle in approximately 1 microsecond.

BRIEF DESCRIPTION OF THE DRAWINGS

FIG. 11 is a block diagram of a modified superresonant filter;

FIG. 12 is a block diagram of an exploded suppressed carrier superresonant filter;

FIG. 13 is as block diagram of an exploded suppressed carrier superresonant filter;

DESCRIPTION OF PREFERRED EMBODIMENTS

Bits transferred at a given rate require a channel bandwidth W. The bits are transferred in timed pulses. The required bandwidth W allows the reception of white noise of the same bandwidth. The white noise increases in power directly with the bandwidth W. The information pulse is stronger in power than the received noise power by a multiple to insure error free reception of a prescribed quality. The multiple is actually the signal-to-noise ratio (SN ratio). The prescribed quality is the bit error rate. As is apparent, the power required to transmit information increases with the pulse power and the pulse rate.

For example, a one megabit per second information rate is equivalent to a pulse 1 MHz wide. When multiple amplitude levels are employed, more information can be sent within the same bandwidth W. Thus, it is possible to reduce the power required to transmit information at any given rate by reducing the power in the spectrum needed by the information pulse. When the pulse spectrum is transformed to an equivalent line spectrum, it retains the same time duration as the information pulse.

Figure 1A:
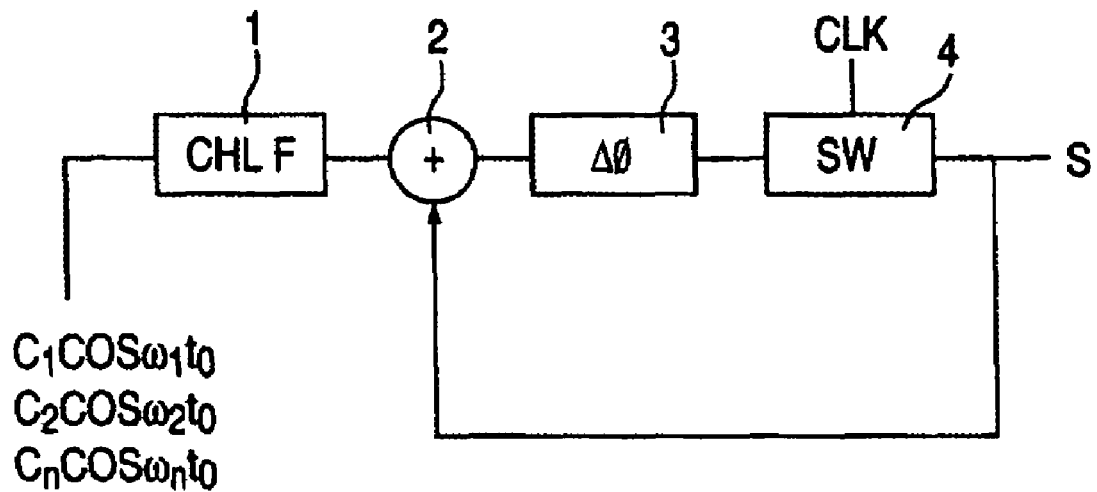
FIGS. 1a and 1b show a phased summing method.
Figure 1B:
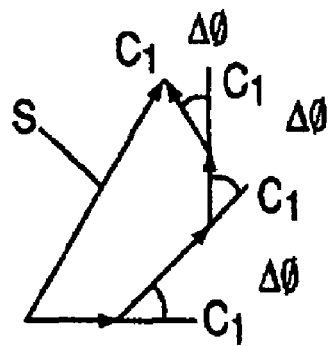
Figure 1C:
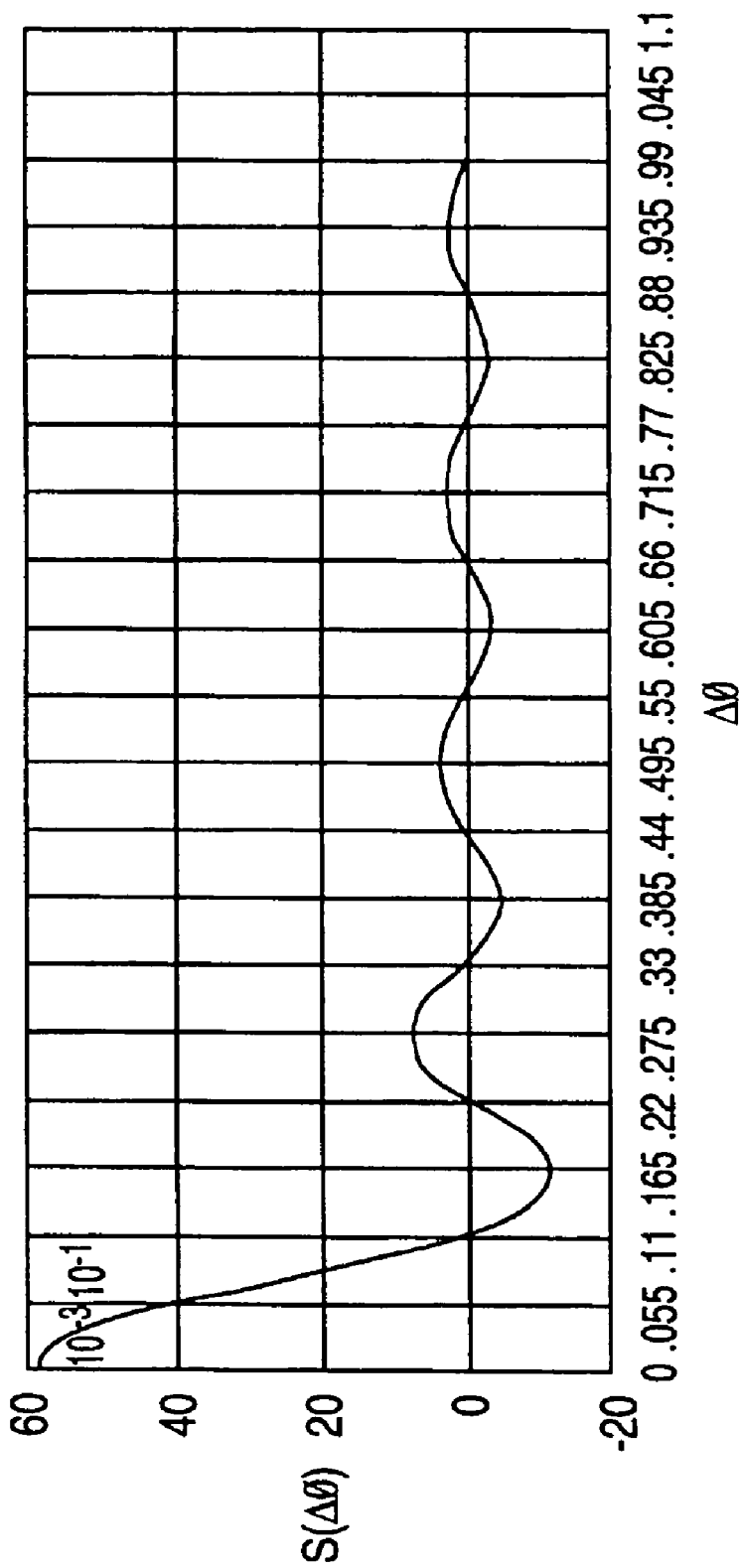
FIG. 1c shows the resulting output of the phase summing method versus vector phase difference ΔΦ for n=60.
Figure 2:
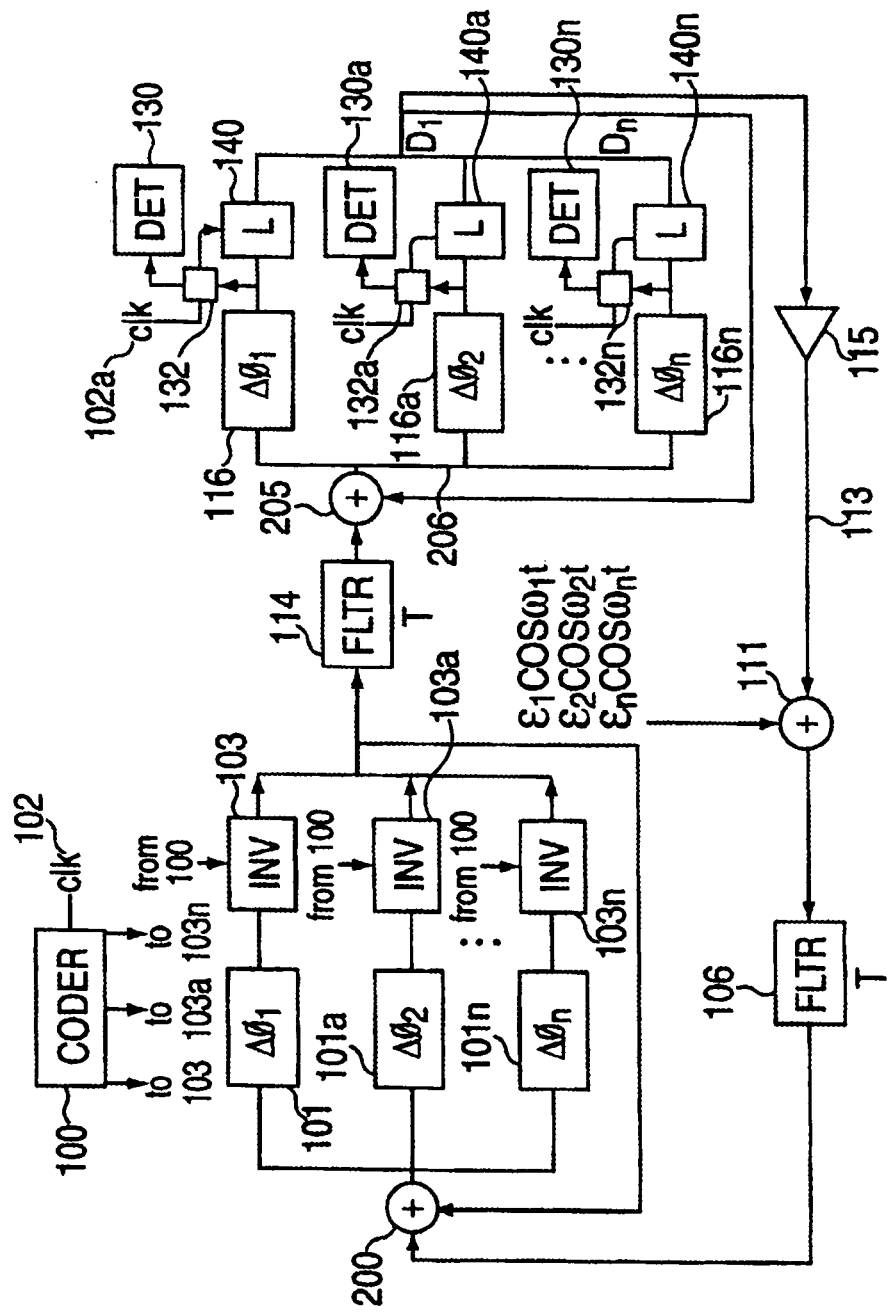
FIG. 2 illustrates a block diagram of a system employing the phase summing method.
Figure 3:
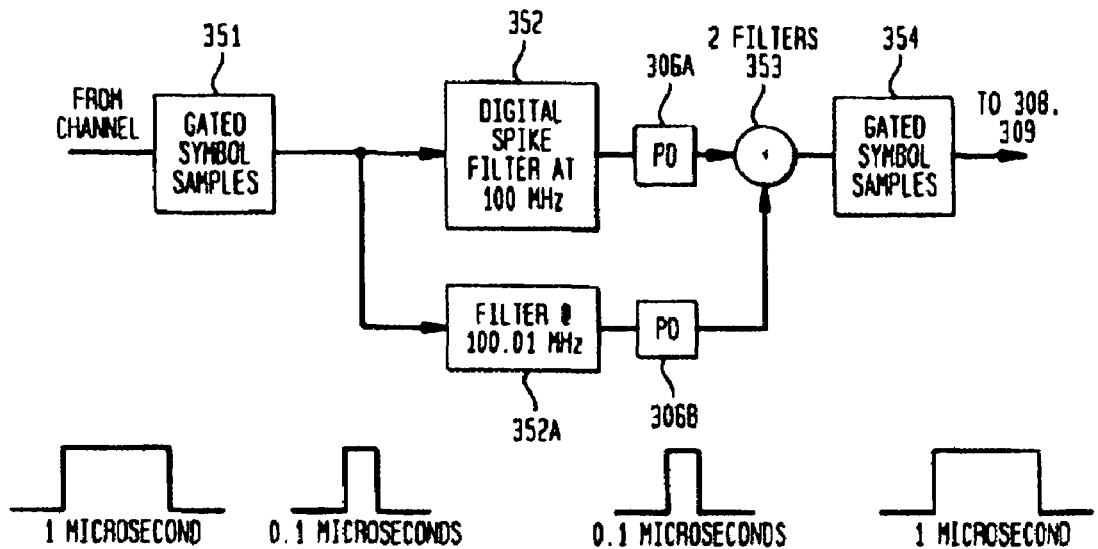
FIG. 3 is a schematic diagram of the use of oversampled digital spike filter.
Figure 4:
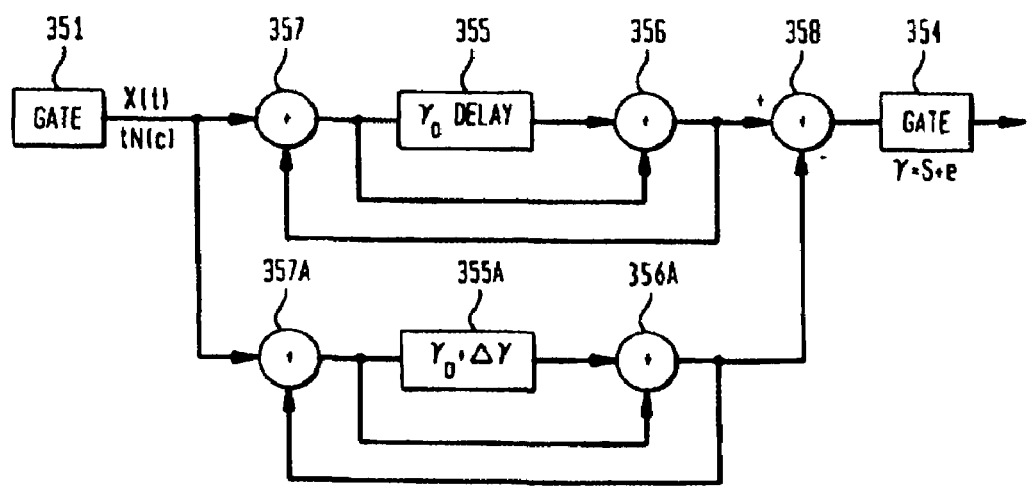
FIG. 4 is a schematic diagram of the use of a recursive type of over-sampled digital spike filter.
Figure 5:
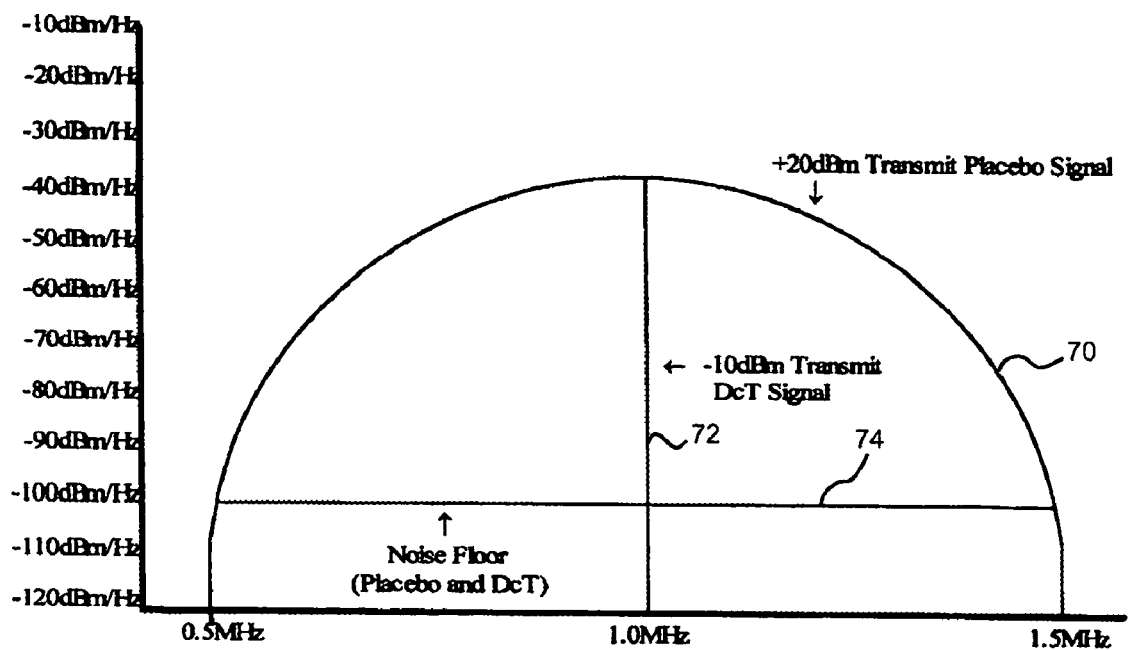
FIG. 5 is a schematic diagram showing spectral compression.

FIG. 5 shows a compression of the spectrum. The hemisphere 70 drawn between 0.5 MHz and 1.5 MHz represents the spectrum of an information pulse as presently transmitted. The vertical line 72 at 1 MHz represents the ideal spectrum as transmitted by the disclosed process. The horizontal line 74 at approximately −100 dBm/Hz is the noise floor.

Figure 6:
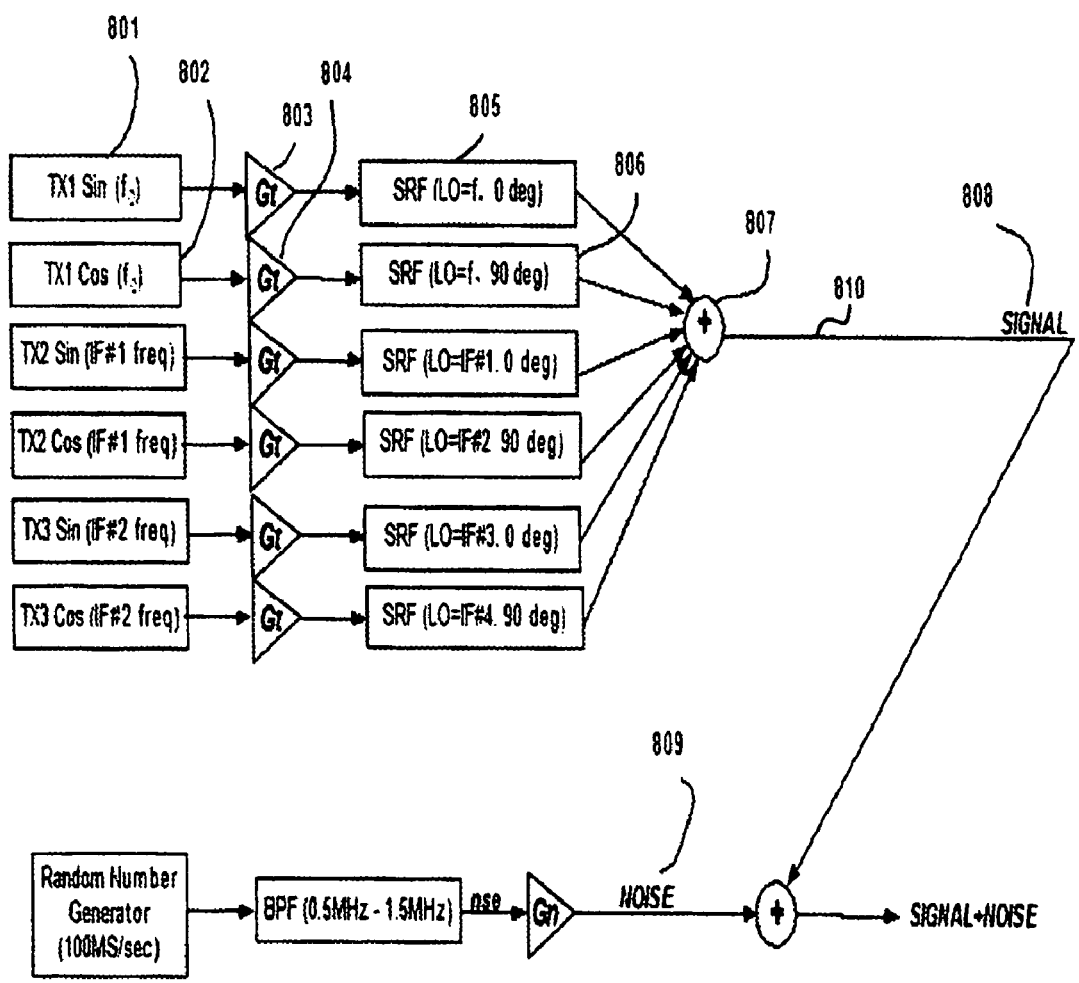
FIG. 6 is a block diagram of a minimum energy information sender.

FIG. 6 is a block diagram of a minimum energy information sender. As shown, signals at multiple frequencies can be transmitted simultaneously. Each frequency can be used to transmit multiple pieces of information. At any given frequency, information can be transmitted on the sine and cosine waves of this frequency. As such, TX1 generated at 801 is transmitted on the sine of $f_o$ in block 801. Likewise, block 802 transmits TX1 on the cosine of $f_o$. The sine and cosine of frequency $f_o$ can be sent and detected during the same bit interval.

The sine input from 801 is processed by super-resonant filter (SRF) 805. The SRF employs a locally generated sine generator operating at $f_o$ in phase with the incoming sine signal. SRF 806 has a local cosine generator operating in phase with the cosine signal generated at 802. Adder 807 linearly adds the signal generated by each of the super-resonant filters. Amplitude adjustors $G_t$ 803, 804, adjust the amplitude of the signal output by the signal generators and input to the SRFs.

For modeling purposes, a noise signal is added to the combined signal 810. The combined signal 810, output from adder 807, is added to a noise signal 809. The noise signal is, in one embodiment, a constant amplitude signal in the range of 0.5 MHz to 1.5 MHz. This signal is created using a random number generating operating at 100 MS/sec. This signal is then fed to the bandpass filter. The system output signal 810 plus the noise 809. In one embodiment of the invention, the filtered noise source is pre-calculated and stored in a file for a consistent noise time wave formula. Further, for analysis purposes, all nodes are observable with a time/waveform power meter.

As shown in FIG. 6, the amplitude adjustors are used in the processing of the signal. Each sine and cosine input is processed by an SRF discussed below. The output of each SRF is confined in a narrow band of frequencies centered about the local oscillator frequency. These frequencies can be readily spaced so as to not to interfere with each other and occupy only a symbol (1 microsecond) in time. Thus, there is a significant increase in channel throughput after these signals are summed. The signal-to-noise ratio of this signal is greatly enhanced over the noise signal 809. The super-resonant frequency filter 805 shown in FIG. 6 is discussed in more detail with reference to FIG. 10 below. In one embodiment of the invention, the local oscillator is the signal source. A branch of the local oscillator is modulated by the data at the symbol rate.

Figure 7:
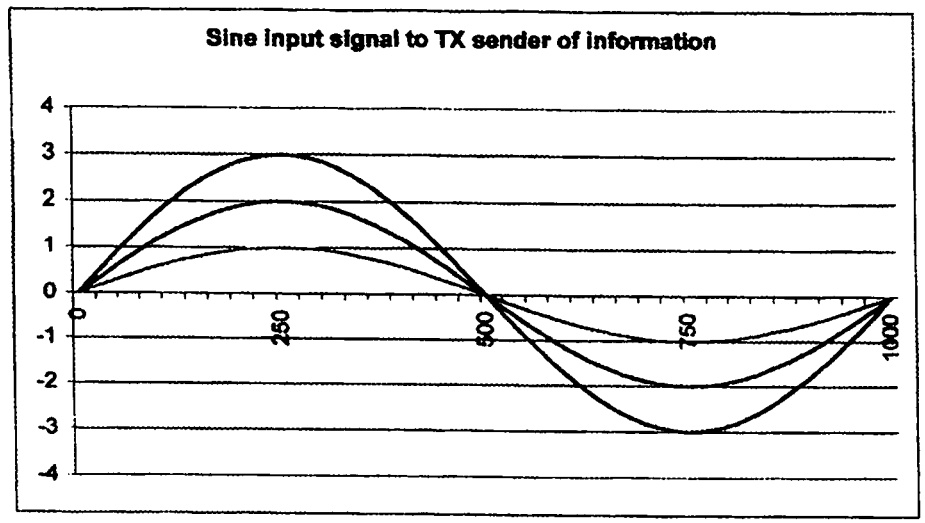
FIG. 7 is a sine input pulse wave shape of TX sender of information.
Figure 8:
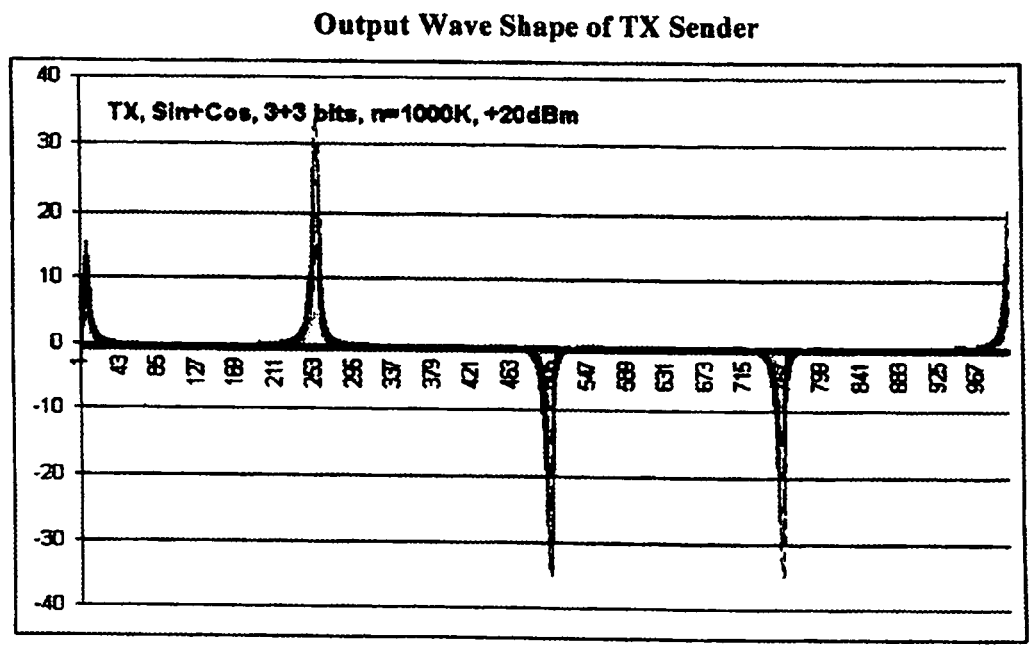
FIG. 8 is an output wave shape of TX sender.

FIG. 7 shows the sine input for several different levels of input. FIG. 8 shows the corresponding outputs of the system. The sine input has sharp peaks at about 250 and 750 nanoseconds, corresponding to the negative and positive peaks of the sine waves. As shown in FIG. 8, the waveform is the summation or accumulation of a series of time samples of the input signals of FIG. 7. In one embodiment, there may be up to 100,000 of these samples per symbol interval. In the frequency domain, each of these pulses occupies a very wide spectrum while only a portion of the spectrum that occupies the transmission channel gets transmitted. As the pulses are added together, the resulting spectrum shrinks. The in-phase portions of the spectrum of each pulse add while the out-of-phase portions do not. The SRF unit restricts transmission to in-phase signals only at a specific frequency. The SRF is not limited to a single frequency but a narrow band of frequencies. As evident from FIG. 8, signals at multiple frequencies can be used. The multiple frequencies will not interfere with each other due to the narrow bandwidth of each signal.

Figure 9:
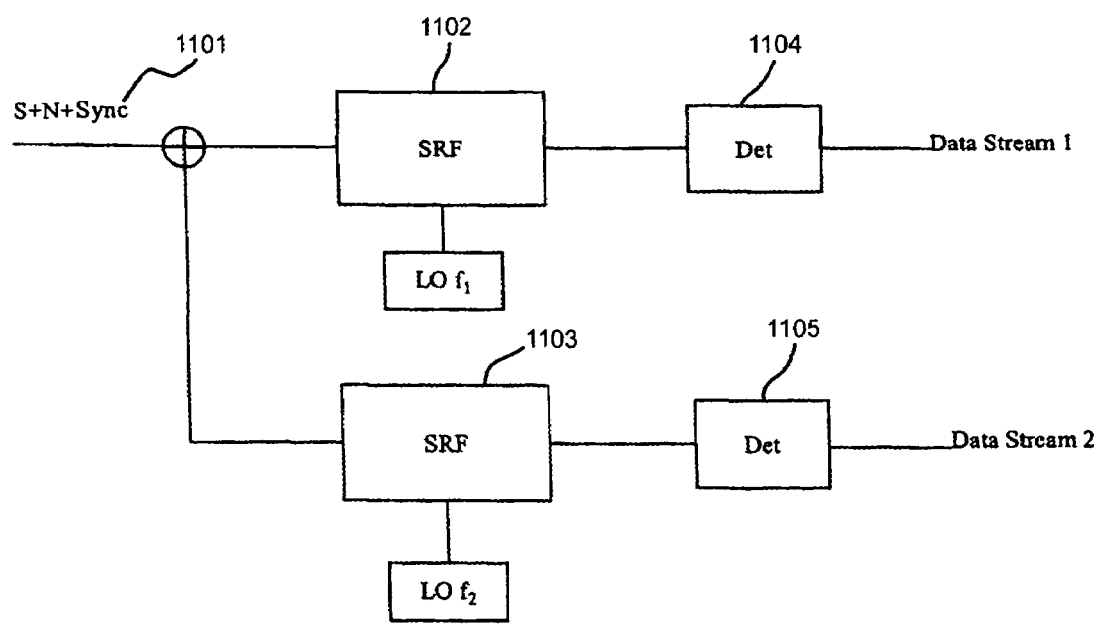
FIG. 9 is a block diagram of a minimum energy receiver.

A receiver, as shown in FIG. 9, is used to decode the received signal transmitted by the transmitter. The receiver decodes the signal transmitted within the transmitted bit. The receiver contains an SRF unit operating at the same frequency and synchronized to a common time reference. The SRF operates for example, at $f_o$ (see, FIG. 6, items 801, 805). The time reference can be transmitted to the receiver without any significant increase in bandwidth. The output of the receiver is similar to the output of the transmit SRF as shown in FIG. 8. In one embodiment, a time synchronized threshold detector is used to convert the digital symbol corresponding to the sender's input symbol.

The receiver input is the signal and noise as well as a synch signal 1101. This signal is input into SRFs 1102 and 1103. If there are additional data streams, additional SRFs can be added. Each SRF has a local oscillator operating at the frequency necessary to decode the data stream. The output of the SRF is then input into detector 1104. The output of detector 1104 is the desired data stream.

The super-resonant filter has advantages over prior art spike filters. One such advantage is the fast settling time of the super-resonant filter. The prior art spike filters take a long time to settle. For example, a 1 hertz narrow pass filter requires one second before its operation is complete. The SRF transmits only a single frequency at a specific phase of a sinusoidal input. The inputs may include noise which is itself a compilation of signals. The input may also include functions of sine waves such as the integral of a sine or cosine wave.

The system operates on samples of the input signal. The sample intervals are much smaller than the period of the complete operation. The process therefore operates over one symbol period or less so there is no coherent relationship between successive symbol periods. Each symbol period starts afresh, although within the symbol period there may be several frequencies which may be recoverable by separate filters.

Figure 10:
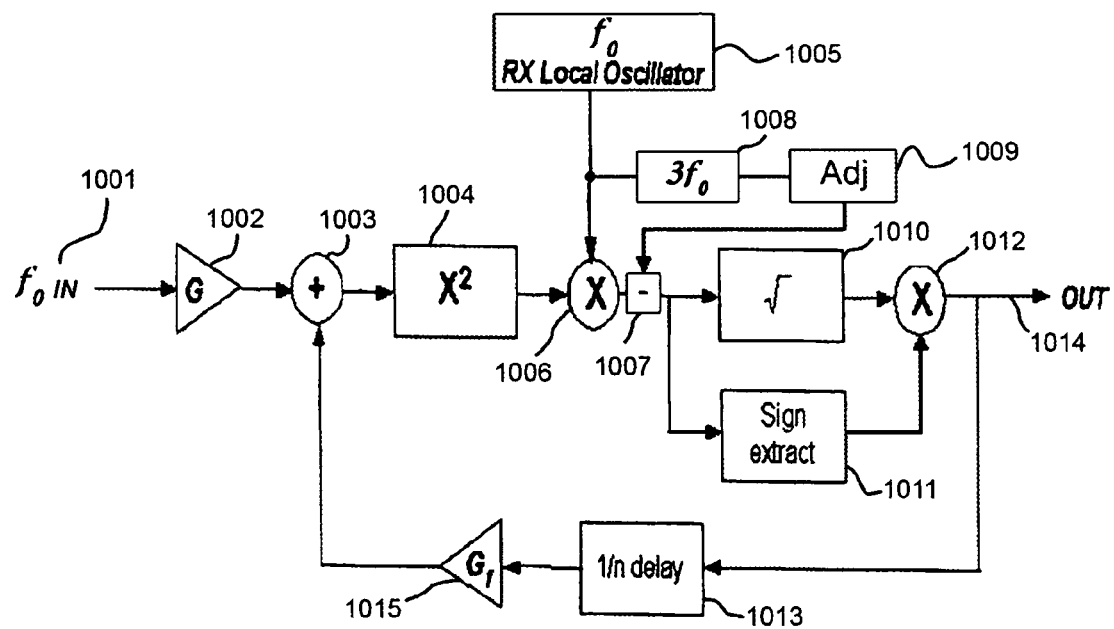
FIG. 10 is a block diagram of a superresonant filter.

As shown in FIG. 10, 1001 comprises the input signals, which are symbols. The signals consist of a cycle of sine waves which differ each symbol period. The sine waves are sampled n times a symbol. Amplitude adjustor 1002 adjusts the amplitude of signal 1001 having a frequency $f_o$. The amplitude adjusted signal is presented to adder 1003 which sums the input time samples and the feedback samples. A squaring function is performed in circuit 1004. Circuit 1004 multiplies the output of summer 1003 by itself thereby producing the square of the summer output. The output of circuit 1004 is a voltage with a frequency of twice the input frequency $f_o$. Local oscillator 1005 oscillates with a frequency $f_o$. In one embodiment, the local oscillator is phase locked to the transmitter frequency and phase. The output of the local oscillator 1005 and output of squaring circuit 1004 are multiplied by multiplier 1006. Multiplier 1006 provides an output $2 f_0 - f_0 =$ and $2 f_0 = f_0 = 3 f_0$ from inputs $2 f_0$ and oscillator $f_0$. The output of multiplier 1006 is presented to subtractor 1007 which is a linear subtractor which is phase and amplitude adjusted to cancel the $3 f_0$ product of multiplier 1006. In one embodiment, a third harmonic generator 1008 generates the third harmonic of $f_0$ or, it may be independently generated, but phase tied to multiplier 1006. In one embodiment, the third harmonic is cancelled at the transmitter, not the receiver. Further, amplitude adjustor 1009 may be used to cancel the signal from third harmonic generator 1008. The output of subtractor 1007 is presented to square root circuit 1010. Circuit 1010 provides the square root of the amplitude of the output of circuit 1006. The input to circuit 1010 is also presented to sign extractor 1011. Sign extractor 1011 extracts the sign of the signal output from multiplier 1006 and this sign is used to multiply the output of the square root in multiplier 1012. The output of multiplier 1012 is also fed back through delay unit 1013 which delays the output sample pulses one sample period (i.e., 1/n). Amplitude adjustor 1015 then adjusts the sample attitude for proper addition.

In circuit 1004, the $x^2$ operation provides sinusoids whose angle has doubled, i.e., $x = a \sin a$ becomes $x^2 = a^2 \sin^2 a$ or $a^2(\sin 2a - 1)$. When this signal is multiplied by the output of the local oscillator 1005 outputting a signal of sine a, the result is $a^2$ sine a. This signal is exactly in phase with the input signal.

It should be noted that the sample of the signal is also in phase with the local oscillator $f_0$. When the sample is delayed by one sample period (1/n), it adds to the newly received sample period. However, before this addition takes place, the square root of $a^2(\sin 2a-1)$sine a which results in a sin a. Because the square root process removes the sign, it is necessary to ensure that the output of the square root process has the input sign restored.

When the local oscillator frequency is not exactly equal to the incoming frequency and phase, the operation is different. When the local frequency angle is $a+\Phi$, the output angle is $2a-a-\Phi$ which equals $a-\Phi$ and when the local frequency angle is $a-\Phi$, the output angle is $a+\Phi$ so whether the incoming signal frequency is above or below the desired locally selected frequency, the feedback delayed signal is out of phase with the input signal and does not add.

The addition of the samples amounts to an integration of the selected sinusoidal wave resulting in a peak signal of n/2π. The sample amplitudes are large over a 30° interval. Thus, the integration is most intense near the peaks of the input signal.

The integration of sequential sampling pulses requires that the spectrum of each overlap the other at the information channel frequency. Only this spectrum is needed to develop and transfer the information across the channel. Thus, the entire spectrum of the sampling pulse is not required. A Z-transformation analysis leads to the same results.

Figure 10A:
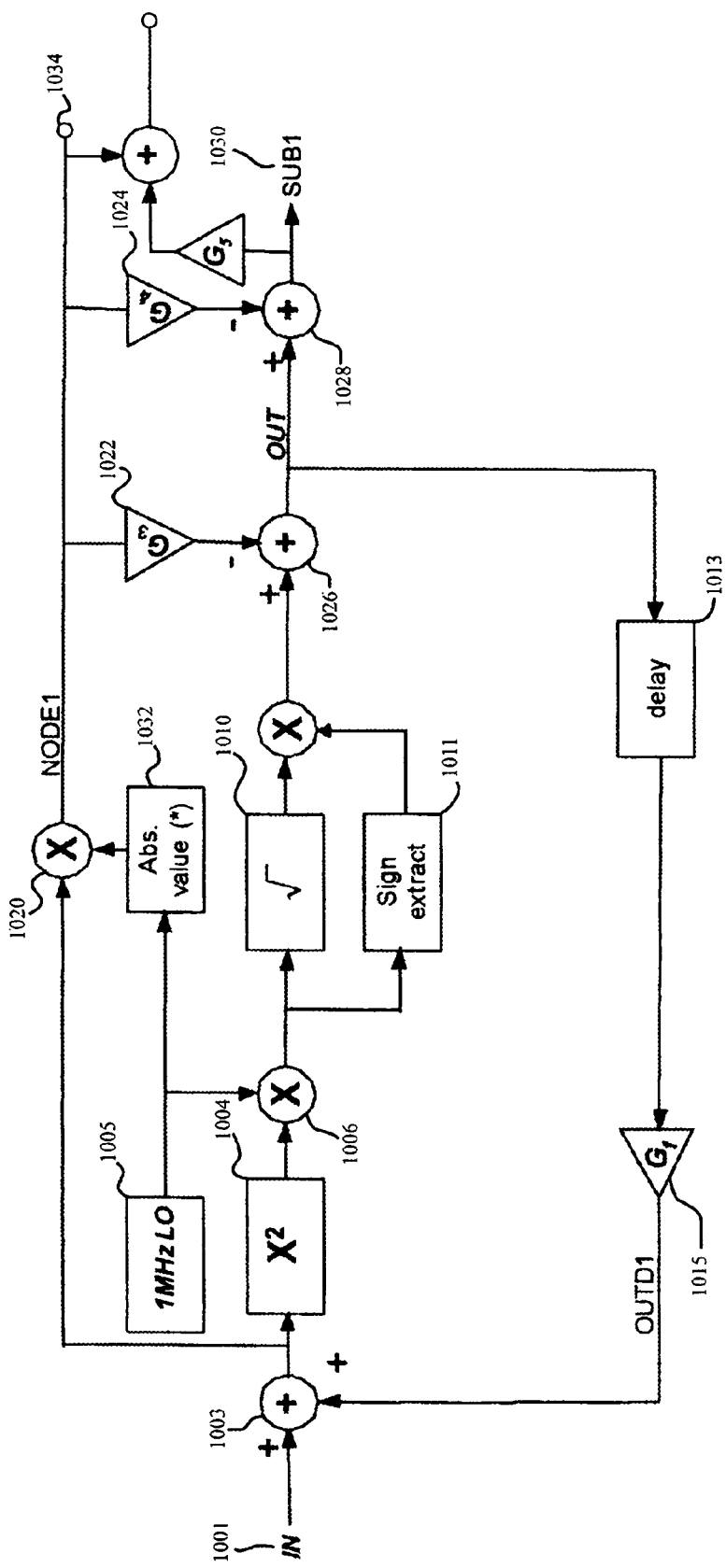
FIG. 10a is another embodiment of a superresonant filter.

FIG. 10a shows an alternate embodiment of an SRF to reduce the third harmonic from the output signal. As shown, in place of a third harmonic generator 1008 the absolute value (1032) of the local oscillator is multiplied at multiplier 1020 with the output of adder 1003. The output of multiplier 1020 is then reintroduced using adders 1026 and 1028 to reduce the third harmonic in the output signal. Components 1022 and 1024 are used to apply the output of multiplier 1020 to adders 1026 and 1028 respectively and terminals 1034 and 1030 are output terminals for multiplier 1020 and adder 1028.

In another embodiment of the invention, an exploded suppressed carrier SRF (ESC-SRF) shown in FIG. 11 can be used. The ESC-SRF differs from the previously discussed SRF in that the square root and sign extract functions are replaced with a variable amplitude local oscillator subtractor block. This has the effect of preventing the local oscillator from bleeding into the output stage of the ESC-SRF. Additionally, the positive feedback loop has been opened and exploded into a number of daisy-chained individual stages. Each of the individual stages is akin to a closed loop iteration discussed above.

The ESC-SRF eliminates the need for the square root function. In one embodiment, the ESC-SRF uses a lower clock rate digital circuitry than the previous SRF architecture and the number of daisy chain stages can be lower than the number of per-symbol iterations in the SRF. Additionally, the ESC-SRF can be used in the receiver side thereby eliminating the need for transmit side additional circuitry including another SRF or ESC-SRF. As shown in FIG. 12, the single stage ESC-SRF is shown. As should be noted in FIG. 12, the positive feedback loop and square root modules are removed. Multiple ESC-SRFs can be combined as shown in FIG. 13 which can include n stages of the ESC-SRF.

In one embodiment of the circuit shown in FIG. 13, there is a last-stage LPF its 3dB point as approximately $2\omega_0$. This filter having a relatively small delay would eliminate all high-frequency components resulting from the various ESC-SRF stages. These components all start at $3\omega_0$ and above.

The equations below derive the open-loop behavior, and without the square root function referring to FIG. 12.

$$IN = \cos(\omega n \Delta t) \quad (1)$$

$$LO = \cos(\omega_0 n \Delta t) \quad (2)$$

$$A = IN \text{(feedback loop is open)} \quad (3)$$

$$B = A^2 = \cos^2(\omega n \Delta t) \quad (4)$$

Using the identity below, substitute into eq. (4)

$$\cos^2(a) = (\tfrac{1}{2}) + (\tfrac{1}{2})\cos(2a)$$

$$B = (\tfrac{1}{2}) + (\tfrac{1}{2})\cos(2\omega n \Delta t) \quad (5)$$

$$C = B \cdot LO = \{(\tfrac{1}{2}) + (\tfrac{1}{2})\cos(2\omega n \Delta t)\} \cdot \cos(\omega_0 n \Delta t) \quad (6)$$

$$C = (\tfrac{1}{2})\cos(\omega_0 n \Delta t) + (\tfrac{1}{2})\cos(2\omega n \Delta t) \cdot \cos(\omega_0 n \Delta t) \quad (7)$$

Substituting the following into eq. (7)

$$\omega = \omega_0 + \Delta\omega$$

$$C = (\tfrac{1}{2})\cos(\omega_0 n \Delta t) + (\tfrac{1}{2})\cos(2(\omega_0 + \Delta\omega)n \Delta t) \cdot \cos(\omega_0 n \Delta t) \quad (8)$$

Using the identity below, substitute for the second term of eq. (8)

$$\cos(a) \cdot \cos(b) = (\tfrac{1}{2})\{\cos(a+b) + \cos(a-b)\}$$

where $a = 2(\omega_0 + \Delta\omega)n\Delta t$
and $b = \omega_0 n \Delta t$, we get $$C = (\tfrac{1}{2})\cos(\omega_0 n \Delta t) + (\tfrac{1}{2})(\tfrac{1}{2})\{\cos(2(\omega_0 + \Delta\omega)n\Delta t + \omega_0 n\Delta t) + \cos(2(\omega_0 + \Delta\omega)n\Delta t - \omega_0 n\Delta t)\} \quad (9)$$

Simplifying the above, we get $$C = (\tfrac{1}{2})\cos(\omega_0 n \Delta t) + (\tfrac{1}{4})\cos(3\omega_0 n\Delta t + 2\Delta\omega n\Delta t) + (\tfrac{1}{4})\cos(\omega_0 n\Delta t + 2\Delta\omega n\Delta t) \quad (10)$$

Finally, and assuming that we subtracted o.5*LO amplitude at this stage, then $$D = C - (\tfrac{1}{2})^i \cos(\omega_0 n \Delta t) \quad (11)$$

The exponent "i" determining the LO-subtraction is removed blow, as we are analyzing a single stage. The value of that exponent is fixed for each stage. Refer to FIG. 13, Substituting eq. (11) into eq. (10), and simplifying, we get $$D = (\tfrac{1}{4})\cos(3\omega_0 n\Delta t + 2\Delta\omega n\Delta t) + (\tfrac{1}{4})\cos(\omega_0 n\Delta t + 2\Delta\omega n\Delta t) \quad (12)$$

Since we are not using the square root block, then the output and D are the same.

Equation (12) shows that for an input $\omega_0 + \Delta\omega$, the output results into two frequency components, one at a very high frequency of $(3\omega_0 + 2\Delta\omega)$ and the other "baseband" component $(\omega_0 + 2\Delta\omega)$.

One of the fundamental operations of the G function in the ESC-SRF is to take-in an "off-center" frequency, and to shift that frequency further away from the center; hence the input $(\omega_0 + \Delta\omega)$ becomes a $(\omega_0 + 2\Delta\omega)$ component, having been shifted in frequency by an additional $(\Delta\omega)$ in the first stage. The amount of frequency shift is equal to $(2^i \Delta\omega)$ for i-stages. Additionally, the amplitude of the continuously-shifted result of an off-center input is attenuated by a factor about $2^i$, although this attenuation is also the same for center-frequency case. Hence, the operation of the ESC-SRF is different from the SRF also in that the amplitude of the center-frequency does not build-up, but rather that the off-center frequency is shifted into higher frequencies. This allows a conventional low pass filter to reduce its amplitude drastically.

For the case where the input is at the center frequency, we have $\Delta\omega = 0$, $\omega = \omega_0$. In this case, equation (12) reduces to:

$$D = (\tfrac{1}{4})\cos(3\omega_0 n\Delta t) + (\tfrac{1}{4})\cos(\omega_0 n\Delta t) \quad (13)$$

Figure 14:
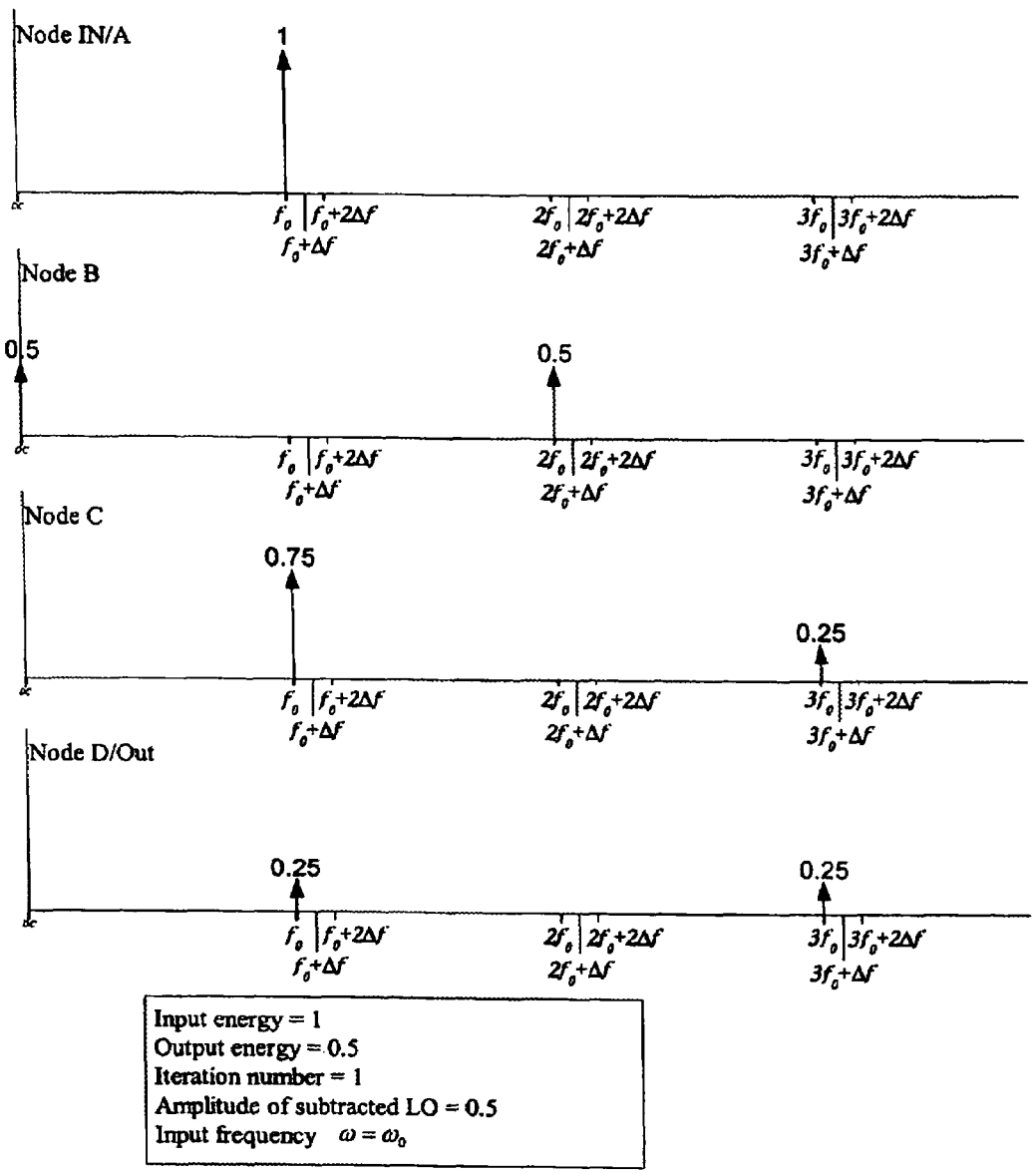
FIG. 14 is a graph of the spectrum at each node of an ESC-SRF.
Figure 15:
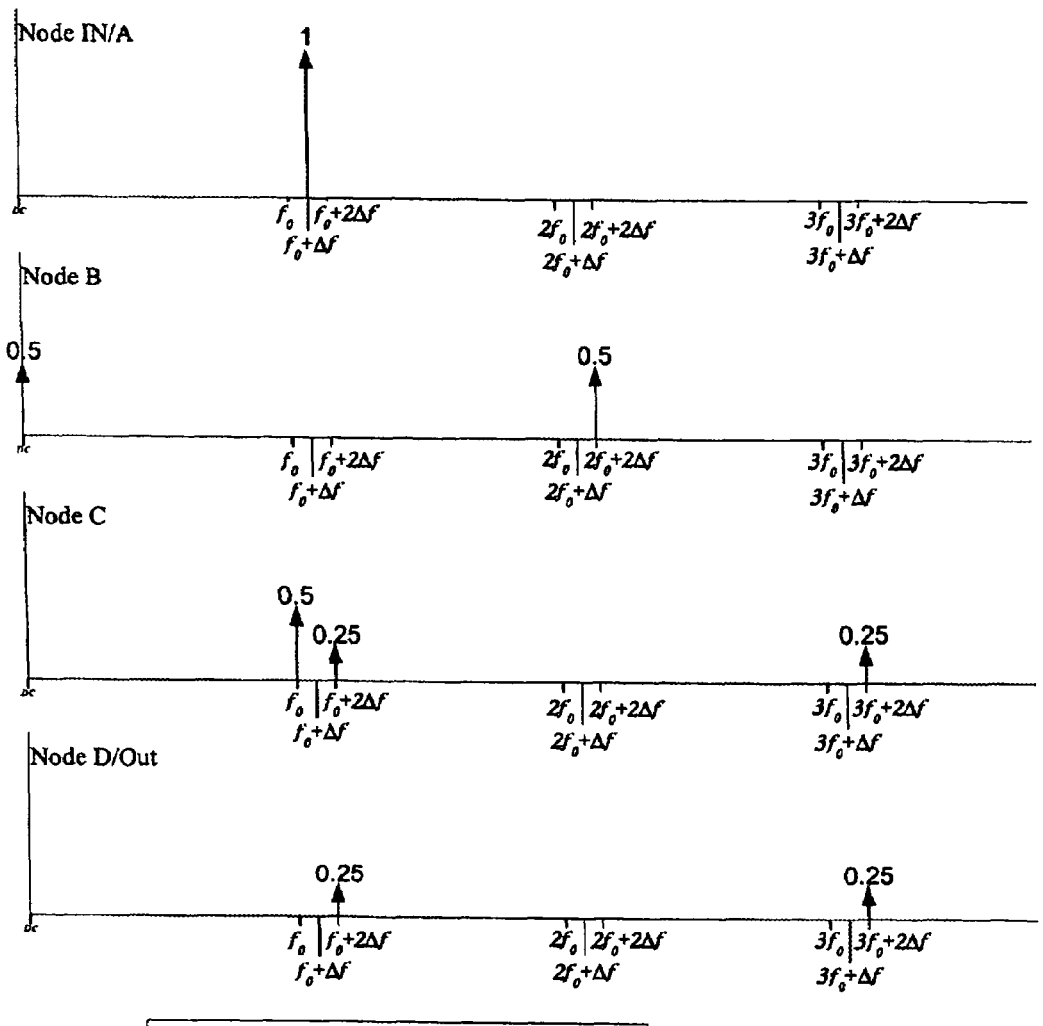
FIG. 15 is a graph of the spectrum at each node of an ESC-SRF.

FIG. 14 shows the spectrum at each node of the ESC-SRF when i=1 and w=0. FIG. 15 shows the spectrum at each node of the ESC-SRF when i=1 and w>w0.

Figure 16:
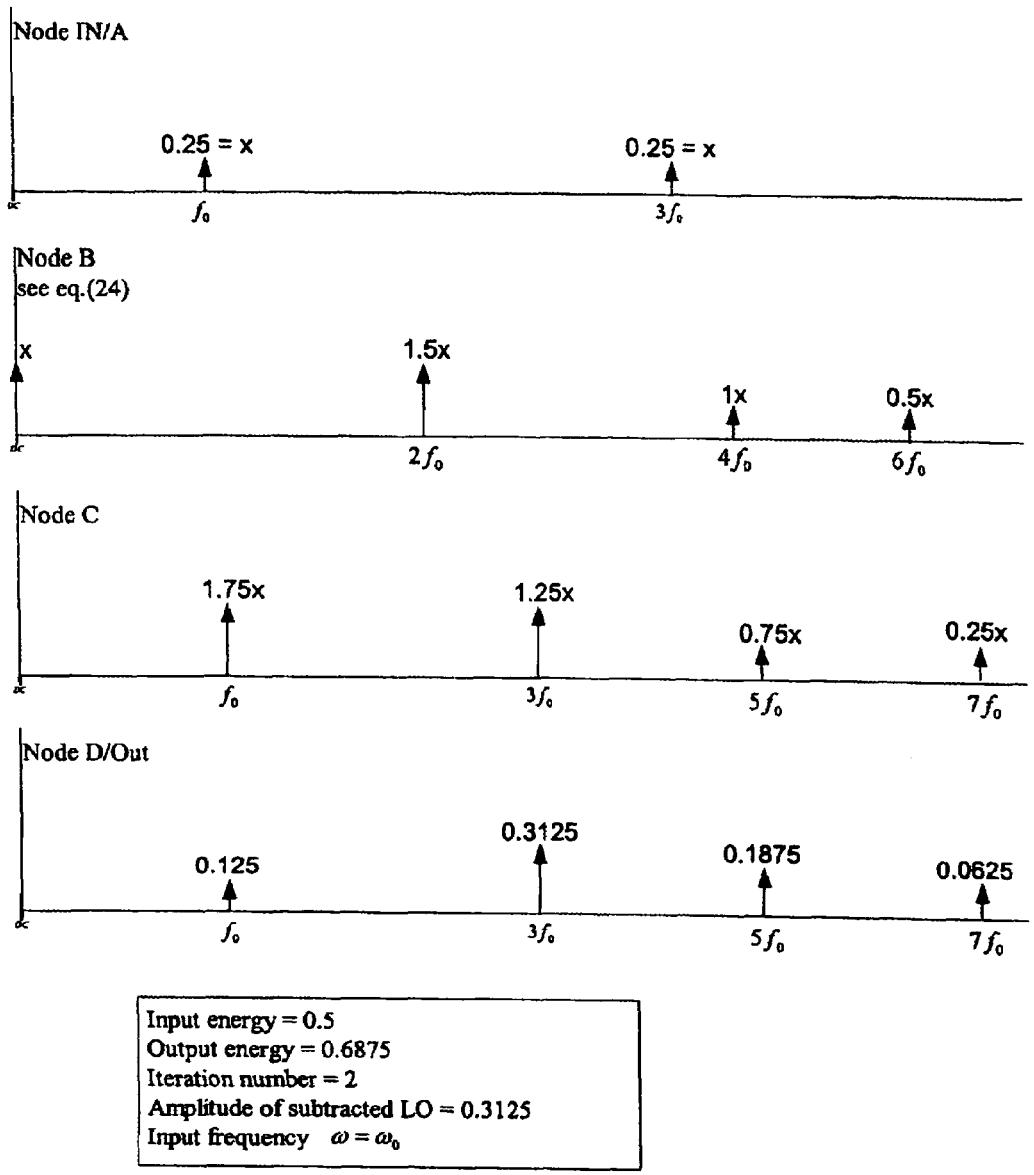
FIG. 16 is a graph of the spectrum at each node of an ESC-SRF.
Figure 17:
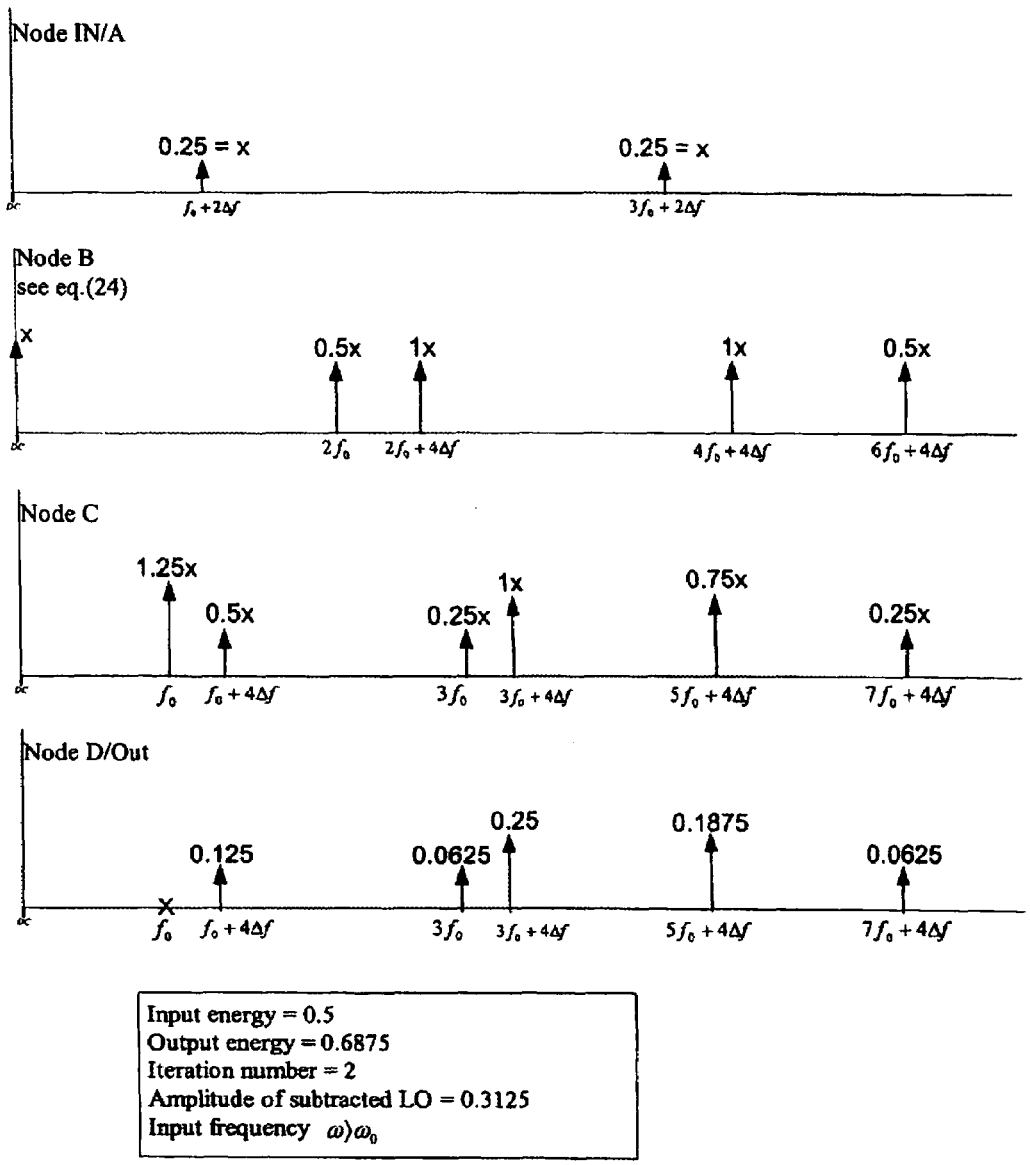
FIG. 17 is a graph of the spectrum at each node of an ESC-SRF.

FIGS. 16 and 17 show a frequency domain graphical representation of the results of each step within a single-stage of an ESC-SRF for iteration number 2, for both cases of input frequency. The inputs to each of these stages is comprises more complex summation of two sinusoids, which results from the first stage's processing.

First, a generalized 2-sinusoid (called J and K) equation when squared for node B is derived.

$$A = IN = \cos(J) + \cos(K) \quad (20)$$

$$B = (\cos(J) + \cos(K))^2 \quad (21)$$

$$B = \cos^2(J) + 2\cos(J)\cos(K) + \cos^2(K) \quad (22)$$

Using the identity $\cos^2(X) = \frac{1}{2}(1 + \cos 2X)$, we get $$B = \frac{1}{2} + \frac{1}{2}\cos(2J) + 2\cos(J)\cos(K) + \frac{1}{2} + \frac{1}{2}\cos(2K) \quad (23)$$

Using the identity $\cos(X)\cos(Y) = \frac{1}{2}(\cos(X+Y))$, and simplifying, we get $$B = 1 + \frac{1}{2}\cos(2J) + \frac{1}{2}\cos(2K) + \cos(J+K) + \cos(J-K) \quad (24)$$

It should be noted that these are fixed factors.

The above equation is used in the graphical representation to show the spectrum of node B for the second iteration. Note that the first time is DC, then next 2 terms are the double-frequency cases, the next term is a high frequency case, and finally, the last term represents a component that generally falls within the band of interest.

The LO subtractor module now subtracts an amount of 1.25 time the input baseband amplitude (or, in absolute terms, 0.3125). The determination of the LO reduction in each stage has not yet been fully derived. It appears to have the form of $$\text{LO-reduction} = 0.25 + 0.25^n$$

Focusing on the "baseband" output of the second stage, the relative amplitude of the two cases are substantially equal, but the off-center input's offset is shifted by another factor of 2 to its new frequency of $\omega_0 + 4\Delta\omega$. This trend continues follows:

$$\omega(n) = \omega_0 + 2\Delta\omega$$

Note that the output amplitude is now smaller, but substantially equal for both "baseband" frequency components.

This third stage analysis of the ESC-SRF is somewhat more complex, given that its input now has either 4 or 5 sinusoidal elements. The main ones being the desired baseband signal and others no lower than $3\omega_0$. If the higher frequency elements are eliminated, although such an intermediate LPF is not shown in the block diagram, then the resulting output for the center frequency case would be a yet-lower amplitude $\omega_0$ components along with its attendant high frequency elements, and the off-center frequency case would yield a baseband term of $\omega_0 + 8\Delta\omega$.

After a sufficient number of stages, the $x\Delta\omega$ component itself becomes a high-frequency term that the LPF eliminates.

It should be noted that in operation, the bit error rate of the SRF does not improve significantly as n increases even though the output signal amplitude does increase with n because the noise level at the operating frequency increases correspondingly. Therefore, the output signal-to-noise ratio does not improve.

The signal-to-noise ratio performance can be improved at the receiver using a canceller circuit. Signals that are received but not processed by an SRF unit at the transmit point are essentially sinusoid signals. Use of a canceller in the receiver can provide outputs that are free of interfering channels, i.e., other data streams that don't operate at the specific frequency chosen for the desired data stream. However, such an output is not free of noise signals occurring at the desired stream frequency.

The noise signal can be greatly reduced by the use of an SRF unit operating at the desired frequency. Such a unit discriminates on a time or phase basis between signal and noise. The noise signal, though at the same frequency as the signal, is very infrequently at the same phase as the signal. In fact, it is likely to be at the same phase 1 out of 1000 times or less. The effectively increases the signal-to-noise ratio by a corresponding amount approximately 20-30 dB. The noise improvement can also augment the improvement obtained from the transmit SRF.

Figure 18:
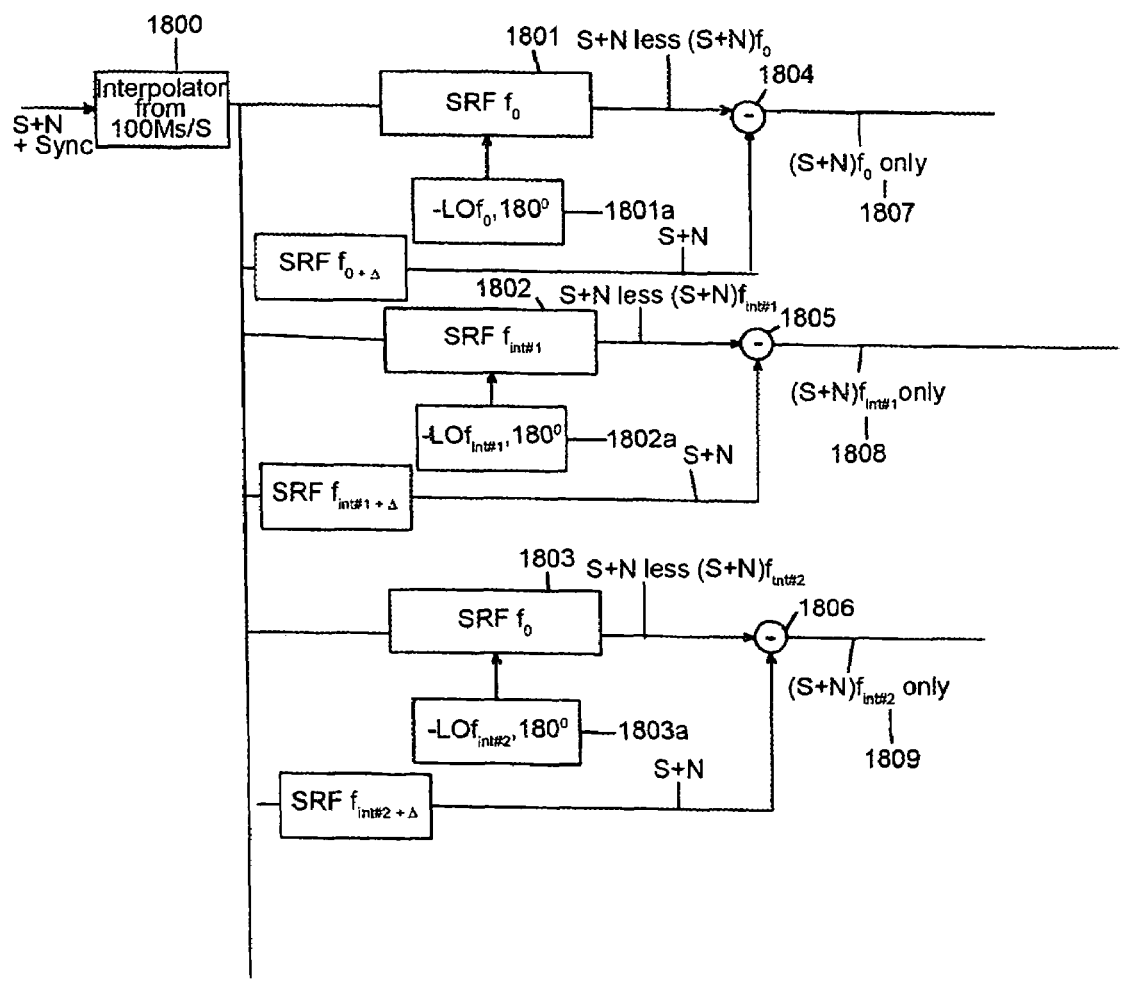
FIG. 18 is a block diagram of a canceling receiver.

FIG. 18 is a block diagram of a canceling receiver. The canceling receiver of FIG. 18 utilizes a noise canceller circuit, which can be effective for a variety of input situations. It should be noted that the input generally consists of signals and Gaussian or Raleigh noise. The signal, noise and synch signals are input into an interpolator 1800. The output from interpolator 1800 is presented to at least one SRF at frequency $f_0$. The SRF at $f_0$ 1801 also receives as an input a local oscillator $f_0 180°$ 180a. The local oscillator does not have to be 180° out of phase if 1804 is an adder. The output of SRF 1801 is the signal and noise minus the signal plus noise at $f_0$. This signal is then presented to a subtractor which subtracts the output from interpolator a second SRF operating in $f_{0+\Delta}$. The SRF at $f_{0+\Delta}$ is combined at adder 1804 so tat the noise signal is effectively cancelled. $\Delta$ is chosen so that the output noise closely correlates with that of 1801 but sufficiently large to reduce the noise content of the SRF. Additionally, other SRFs can be to decode other frequencies. In another embodiment, the samples are subtracted during each iteration. SRFs 1802 and 1803 operate in the same manner as SRF 1801. Local oscillators 1802a and 1803a operate in the same manner as local oscillator 1801a and adders 1805 and 1806 operate in the same manner as adder 1804. Outputs 1807-1809 carry the outputs of SRFs 1801-1803 respectively.

The SRF is useful in the receiver shown in FIG. 18. The receiver receives a signal and noise signal. A noise canceller band on the SRF is used to cancel the incoming noise to improve the signal-to-noise ratio in addition to the imprint in the signal-to-noise ratio provided by a transmitter using an SRF. FIG. 8 represents the signal transmitted by a sender that employs the SRF unit. This signal provides an improved signal-to-noise ratio by virtue of transforming a pulse signal into a peak signal which occupies a reduced spectrum and time interval. The signals and the noise are sampled in the interpolation unit 1800 at a rate much higher than the symbol rate. A synch time reference is also provided over the transmission medium. The sampled signal and noise signals are provided to various reverse SRF units. Each of these SRF units is operating at a different frequency within the channel band.

Using the same wave, the disclosed invention transforms that pulse and changes the spectrum to almost a line. Thus, approximately 16 Mbits can be processed in 1 microsecond. When each bit is spaced at 10 hertz, each sample of a vector acts as the whole vector. The signal appears as a spike but it is a result of the integration of many samples.

The inventive digital system is a transfer function that causes a possible differential phase shift for various input frequencies. Each frequency is processed independently. The transfer function is repeated numerous times within each sample period. The result is an output where each input frequency is discriminated from one another. The repetition is performed in a closed loop, i.e., the SRF, a sequential series of circuits, i.e., ESC-SRF, or another implementation of a forward transfer function with a cumulative property.

The circuit implementation for the various embodiments can be done using single or multiple physical circuits. Design choices will dictate the use of feedback looping, daisy-chaining, pipelining, or other methods where circuit complexity and operating frequency are considered. Additionally, DSP chips or FPGAs can be used to do the processing which would include the accumulation of differential phase. Further, a processor programmed to perform the apparatus algorithm can be used to implement the disclosed system.

Although the present invention has been described in relation to particular embodiments thereof, many other variations and other uses will be apparent to those skilled in the art. It is preferred, therefore, that the present invention be limited not by the specific disclosure herein, but only by the scope of the claims.

What is claimed is:

1. A transmission system for reduced energy transmission comprising:
    means for simultaneously encoding a group of parallel binary bits into a voltage amplitude signal having a phase,
    a superresonant filter having a local oscillator operating in phase with the voltage amplitude signal, the superresonant filter receiving the voltage amplitude signal and accumulating phase shift of samples with multiple iterations during at most a single period of a frequency and outputting a data signal the superresonant filter comprising:
    an adder for adding the voltage amplitude signal with a feedback signal;
    a squaring circuit for squaring the output of the adder;
    a first multiplier multiplying the squared output with an output of the local oscillator;
    a sign extracter to extract the sign of the first multiplier output;
    a square root circuit for taking the square root of the first multiplier output;
    a second multiplier for multiplying the output of the square root circuit and the output of the sign extracter; and
    a delay circuit for delaying the output of the second multiplier to produce the feedback signal.

2. The transmission system of claim 1, the superresonant filter further comprising:
    an amplitude adjuster for adjusting the amplitude of the voltage amplitude signal.

3. The transmission system of claim 1 wherein the delay of the delay circuit is one sample period.

4. A transmission system for reduced energy transmission comprising:
    means for simultaneously encoding a group of parallel binary bits into a voltage amplitude signal having a phase,
    a superresonant filter having a local oscillator operating in phase with the voltage amplitude signal, the superresonant filter receiving the voltage amplitude signal and accumulating phase shift of samples with multiple iterations during at most a single period of a frequency and outputting a data signal the superresonant filter comprising:
    a first adder for adding the voltage amplitude signal with a feedback signal;
    a squaring circuit for squaring the output of the adder;
    a first multiplier multiplying the squared output with an output of the local oscillator;
    a second adder for adding an output of the first multiplier and an amplitude adjusted output of the local oscillator;
    a sign extracter to extract the sign of the second adder output;
    a square root circuit for taking the square root of the second adder output;
    a second multiplier for multiplying the output of the square root circuit and the output of the sign extracter; and
    a delay circuit for delaying the output of the second multiplier to produce the feedback signal.

5. A superresonant filter comprising: an adder for adding a voltage amplitude signal with a feedback signal;
    a squaring circuit for squaring the output of the adder;
    a first multiplier multiplying the squared output with an output of a local oscillator;
    a sign extracter to extract the sign of the first multiplier output;
    a square root circuit for taking the square root of the first multiplier output;
    a second multiplier for multiplying the output of the square root circuit and the output of the sign extractor; and
    a delay circuit for delaying the output of the second multiplier to produce the feedback signal.

* * * * *